(12) United States Patent
Shimura et al.

(10) Patent No.: US 11,605,884 B2
(45) Date of Patent: Mar. 14, 2023

(54) PLANAR ANTENNA AND WIRELESS MODULE

(71) Applicant: SUMITOMO ELECTRIC INDUSTRIES, LTD., Osaka (JP)

(72) Inventors: Tatsuhiro Shimura, Osaka (JP); Isao Katsura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 11 days.

(21) Appl. No.: 17/370,552

(22) Filed: Jul. 8, 2021

(65) Prior Publication Data

US 2021/0336330 A1    Oct. 28, 2021

Related U.S. Application Data

(62) Division of application No. 16/484,843, filed as application No. PCT/JP2018/006199 on Feb. 21, 2018, now Pat. No. 11,095,022.

(30) Foreign Application Priority Data

Mar. 30, 2017   (JP) ................................ 2017-067690

(51) Int. Cl.
*H01Q 1/38* (2006.01)
*H05K 1/02* (2006.01)
*H01Q 1/22* (2006.01)
*H01Q 13/08* (2006.01)

(52) U.S. Cl.
CPC ............. *H01Q 1/38* (2013.01); *H01Q 1/2283* (2013.01); *H01Q 13/08* (2013.01); *H05K 1/028* (2013.01)

(58) Field of Classification Search
CPC ........ H01Q 1/2283; H01Q 1/38; H01Q 1/422; H01Q 15/0026; H05K 1/028
See application file for complete search history.

(56) References Cited

U.S. PATENT DOCUMENTS

| | | | |
|---|---|---|---|
| 4,903,033 A | 2/1990 | Tsao et al. | |
| 5,043,738 A * | 8/1991 | Shapiro | H01Q 9/0435 343/700 MS |
| 5,165,109 A | 11/1992 | Han et al. | |
| 5,187,490 A | 2/1993 | Ohta et al. | |
| 5,798,734 A * | 8/1998 | Ohtsuka | H01Q 9/0407 343/846 |
| 5,801,660 A * | 9/1998 | Ohtsuka | H01Q 9/0471 343/846 |

(Continued)

FOREIGN PATENT DOCUMENTS

| | | |
|---|---|---|
| JP | H04-349704 A | 12/1992 |
| JP | 2003-087022 A | 3/2003 |

(Continued)

*Primary Examiner* — Jason Crawford
(74) *Attorney, Agent, or Firm* — Faegre Drinker Biddle & Reath LLP

(57) ABSTRACT

A planar antenna includes: a radiating element; a flexible dielectric film portion; a power feeder line provided for the dielectric film portion, and configured to feed power to the radiating element; a first ground conductor facing against the radiating element; and an antenna base having a dielectric layer disposed between the radiating element and the first ground conductor. The dielectric film portion extends from a side surface of the antenna base. The dielectric layer is thicker than the dielectric film portion.

8 Claims, 8 Drawing Sheets

(56) References Cited

U.S. PATENT DOCUMENTS

| | | | |
|---|---|---|---|
| 6,788,256 B2 | 9/2004 | Hollister | |
| 7,265,719 B1 | 9/2007 | Moosbrugger et al. | |
| 10,122,058 B2 | 11/2018 | Oguri et al. | |
| 10,826,174 B2* | 11/2020 | Hara | H01Q 21/22 |
| 11,095,022 B2* | 8/2021 | Shimura | H01Q 21/065 |
| 2005/0275590 A1* | 12/2005 | Eom | H01Q 1/22 |
| | | | 343/700 MS |
| 2009/0065594 A1* | 3/2009 | Kato | H01Q 1/50 |
| | | | 235/492 |
| 2010/0090903 A1* | 4/2010 | Byun | H01Q 9/0414 |
| | | | 343/700 MS |
| 2011/0050534 A1* | 3/2011 | Shimayama | H01P 5/028 |
| | | | 343/850 |
| 2011/0279326 A1* | 11/2011 | Dokai | H01Q 1/38 |
| | | | 343/700 MS |
| 2012/0242547 A1* | 9/2012 | Fujii | H01Q 1/38 |
| | | | 343/700 MS |
| 2013/0038501 A1* | 2/2013 | Kato | H01Q 9/0407 |
| | | | 343/860 |
| 2015/0194730 A1* | 7/2015 | Sudo | H01Q 5/378 |
| | | | 343/905 |
| 2017/0279177 A1* | 9/2017 | Oguri | H03H 7/38 |
| 2020/0028251 A1* | 1/2020 | Shimura | H05K 1/165 |
| 2021/0175609 A1* | 6/2021 | Ryoo | H01Q 1/2283 |
| 2021/0336330 A1* | 10/2021 | Shimura | H01Q 13/08 |
| 2022/0006178 A1* | 1/2022 | Shimura | H01Q 1/42 |

FOREIGN PATENT DOCUMENTS

| | | |
|---|---|---|
| JP | 2006-197072 A | 7/2006 |
| JP | 2007-89109 A | 4/2007 |
| JP | 2012-029163 A | 2/2012 |
| WO | WO-2017/051649 A1 | 3/2017 |

* cited by examiner

PLANAR ANTENNA AND WIRELESS MODULE

The present application is a Divisional Application of U.S. patent application Ser. No. 16/484,843, filed Aug. 9, 2019, which is a National Stage Entry of PCT/JP2018/006199, filed Feb. 21, 2018, which claims priority based on Japanese Patent Application No. 2017-067690 filed on 30 Mar. 2017, the entire disclosure of each of which is incorporated herein by reference.

TECHNICAL FIELD

The present invention relates to a planar antenna and a wireless module.

BACKGROUND ART

Patent Literatures 1 and 2 disclose a planar antenna using a flexible substrate.

CITATION LIST

Patent Literature

Patent Literature 1: Japanese Laid-Open Patent Publication No. 2006-197072
Patent Literature 2: Japanese Laid-Open Patent Publication No. 2007-89109

SUMMARY OF INVENTION

A planar antenna according to one embodiment includes: a radiating element; a flexible dielectric film portion; a power feeder line provided for the dielectric film portion, and configured to feed power to the radiating element; a first ground conductor facing against the radiating element; and an antenna base having a dielectric layer disposed between the radiating element and the first ground conductor. The dielectric film extends from a side surface of the antenna base, and the antenna base is thicker than the dielectric film. The dielectric film portion extends from the side surface of the dielectric layer.

A wireless module according to another embodiment includes: a radiating element; a flexible dielectric film portion; a power feeder line provided for the dielectric film portion, and configured to feed power to the radiating element; a first ground conductor facing against the radiating element; an antenna base having a dielectric layer that is thicker than the dielectric film portion, the dielectric layer being disposed between the radiating element and the first ground conductor, the dielectric film portion extending from a side surface of the antenna base; and a wireless unit to which the power feeder line is connected.

DESCRIPTION OF EMBODIMENTS

Problems to be Solved by Disclosure

Figure 1:
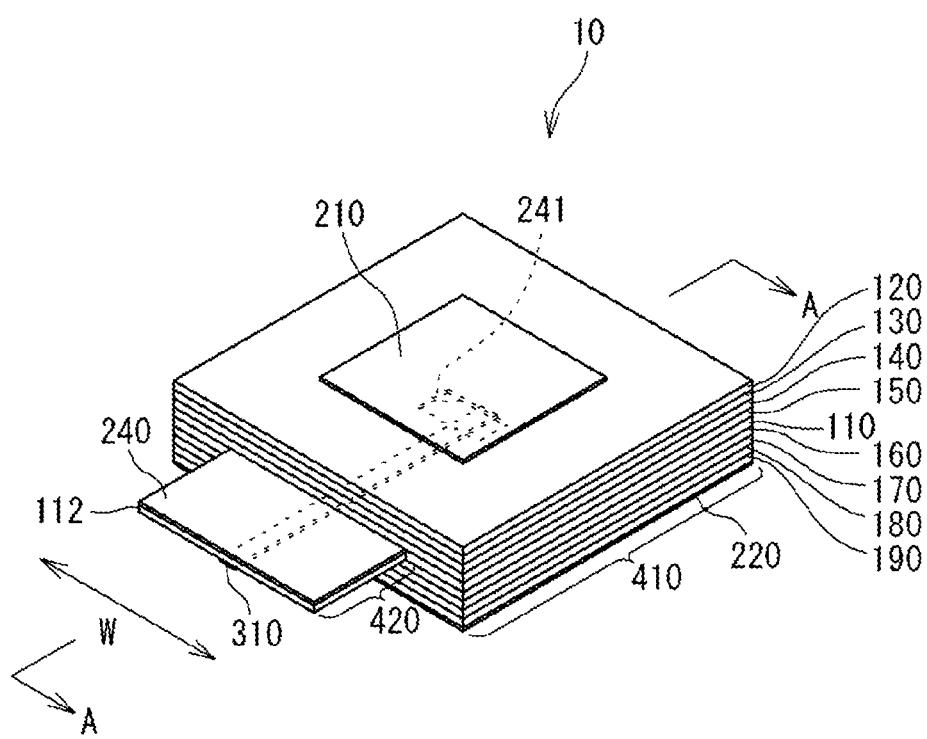
FIG. 1 is a perspective view of a planar antenna.

A flexible substrate is made thin so that the substrate can be flexed. Because the substrate is very thin, it is not easy for a planar antenna using the flexible substrate to obtain a broadband performance.

Taking a microstrip antenna as an example of the planar antenna into consideration, the antenna may be provided with a wider bandwidth by increasing a thickness of the substrate and thus increasing a distance between a radiating element and a ground conductor. However, increasing the thickness of the substrate impairs flexibility as the flexible substrate. Therefore, it is not easy to provide a substrate with a wider bandwidth while maintaining flexibility as the flexible substrate.

It is desired to ensure a broadband performance while flexibility as the flexible substrate is maintained.

In one embodiment, a planar antenna includes a dielectric layer that is thicker than a flexible dielectric film portion provided with a power feeder line. With such a thick dielectric layer, a broadband performance of the planar antenna may be ensured.

Effects of Disclosure

It is possible to ensure a broadband performance because while the dielectric film portion having a power feeder line is flexible, the dielectric layer provided with a radiating element is thicker than the dielectric film portion.

1. Outline of Embodiments (1) A planar antenna according to the embodiment includes: a radiating element; a flexible dielectric film portion; a power feeder line provided for the dielectric film portion, and configured to feed power to the radiating element; a first ground conductor facing against the radiating element; and an antenna base having a dielectric layer disposed between the radiating element and the first ground conductor. The dielectric film portion extends from a side surface of the antenna base, and the dielectric layer is thicker than the dielectric film portion. The dielectric film portion extends seamlessly from the side surface of the dielectric layer. The dielectric layer is thicker than the dielectric film portion. As the dielectric film portion provided with the power feeder line is flexible, and the dielectric layer provided with the radiating element is thicker than the dielectric film portion, it is possible to ensure a broadband performance.

The flexible dielectric film portion is a dielectric body that is sufficiently thin to be able to be flexed like a flexible substrate. As a preferred example of the flexible dielectric film portion, it is possible to use, but not limited to, a base film used for the flexible substrate. The dielectric layer may have a rigidity that hardly allows the dielectric layer to be flexed like a rigid substrate, or may have a flexibility that allows the dielectric layer to be flexed to some extent.

The dielectric film portion may extend from one side surface of the antenna base, or from more than one side surfaces. For example, when the antenna base is rectangular in planar view, the dielectric film portion may extend from one, two, three, or four of four side surfaces.

(2) Preferably, the dielectric film portion extends seamlessly from the side surface of the antenna base. The term "extends seamlessly" means that the dielectric film portion is provided with at least a portion of the antenna base in an integrated manner, and not provided for the antenna base via a joint part (seam) such as adhesion. By the dielectric film portion extending seamlessly from the antenna base, integrity of the dielectric film portion and the antenna base increases and a robust structure may be provided. Here, the dielectric film portion may or may not extend seamlessly from the dielectric layer disposed between the radiating element and the first ground conductor.

(3) The antenna base may include: a main layer seamless with the dielectric film portion; and one or more subsidiary layers laminated over the main layer. The main layer seamless with the dielectric film portion is useful in order to increase integrity between the dielectric film portion and the antenna base. By laminating the subsidiary layer over the main layer, it is possible to increase the thickness of the antenna base as compared to the main layer seamless with the dielectric film portion. In the embodiment, for example, out of a single film, it is possible to provide a region where the subsidiary layer is laminated as the main layer, and a region where the subsidiary layer is not laminated as the dielectric film portion.

(4) It is preferable that the one or more subsidiary layers include one or more first subsidiary layers and one or more second subsidiary layers, the first subsidiary layers being laminated on a side of a first surface of the main layer, the second subsidiary layers being laminated on a side of a second surface as a surface opposite of the first surface. It is possible to easily increase the thickness by laminating the subsidiary layers over both surfaces of the main layer.

(5) It is preferable that one of the radiating element and the first ground conductor is provided for the first subsidiary layer, and another of the radiating element and the first ground conductor is provided for the second subsidiary layer. It is possible to easily increase a distance between the radiating element and the first ground conductor by providing the radiating element and the first ground conductor for the subsidiary layers.

(6) It is preferable that a number of the one or more first subsidiary layers is equal to a number of the one or more second subsidiary layers. By making the number of the first subsidiary layers and the number of the second subsidiary layers, it is possible to suppress deformation of the antenna base.

(7) It is preferable that one of the first ground conductor and the radiating element is provided for the main layer. Wiring for power feeding may be facilitated by providing one of the first ground conductor and the radiating element for the main layer seamless with the dielectric film portion.

(8) It is preferable that the first ground conductor is provided for the main layer, and connected to a second ground conductor for power feeding, the second ground conductor being provided for the dielectric film portion seamless with the main layer. In this case, connection between the first ground conductor and the second ground conductor is facilitated.

(9) It is preferable that the radiating element is provided for the main layer, and connected to a power feeder line provided for the dielectric film portion seamless with the main layer. In this case, connection between the radiating element and the power feeder line is facilitated.

(10) It is preferred that the dielectric layer includes the one or more subsidiary layers. It is possible to easily obtain a thick dielectric layer using the subsidiary layers.

(11) It is preferable that the antenna base includes a layer that is seamless with and thicker than the dielectric film portion. In this case, it is possible to easily obtain a thick dielectric layer.

(12) It is preferable that the planar antenna is configured either for millimeter waves or for radio waves shorter than the millimeter waves. The millimeter waves are radio waves whose wavelength is on the order of millimeters (1 mm to 10 mm). A size of the radiating element depends on the wavelength of the radio waves, and can be smaller as the wavelength is shorter. The radiating element of the planar antenna configured either for millimeter waves or for radio waves shorter than the millimeter waves is as small as several millimeters or smaller, for example. Therefore, the dielectric layer can be small, and an influence of lower flexibility due to the dielectric layer being thick may be reduced.

(13) A wireless module according to an embodiment includes: a radiating element; a flexible dielectric film portion; a power feeder line provided for the dielectric film portion, and configured to feed power to the radiating element; a first ground conductor facing against the radiating element; an antenna base having a dielectric layer that is thicker than the dielectric film portion, the dielectric layer being disposed between the radiating element and the first ground conductor, the dielectric film portion extending from a side surface of the antenna base; and a wireless unit to which the power feeder line is connected. An example of the wireless module is an RF front-end module of a mobile station or a base station in mobile communication. The wireless module may also be a mobile station itself or a base station itself in mobile communication.

2. Details of Embodiments

[2.1 Planar Antenna]

Figure 2:
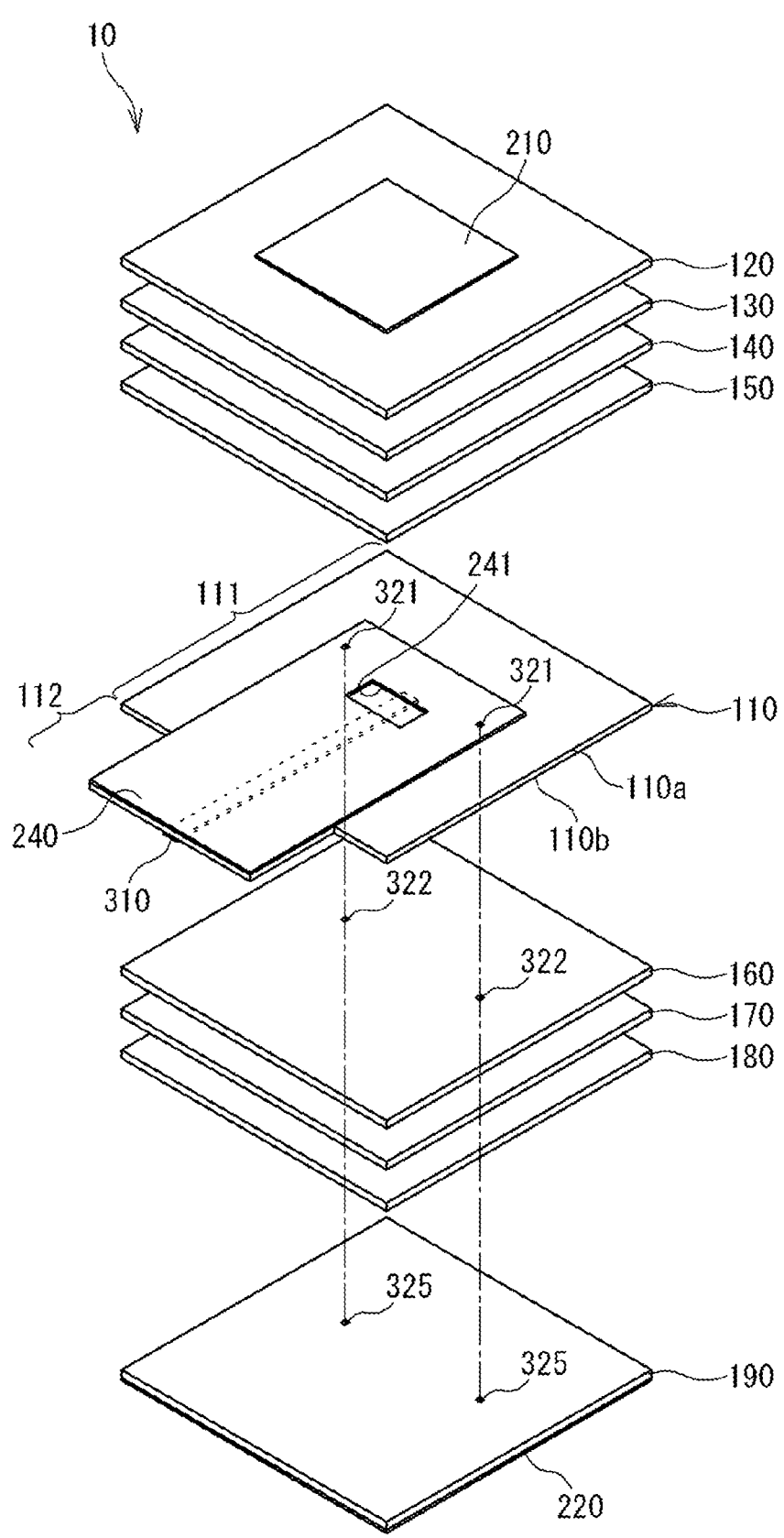
FIG. 2 is an exploded perspective view of the planar antenna.
Figure 3:
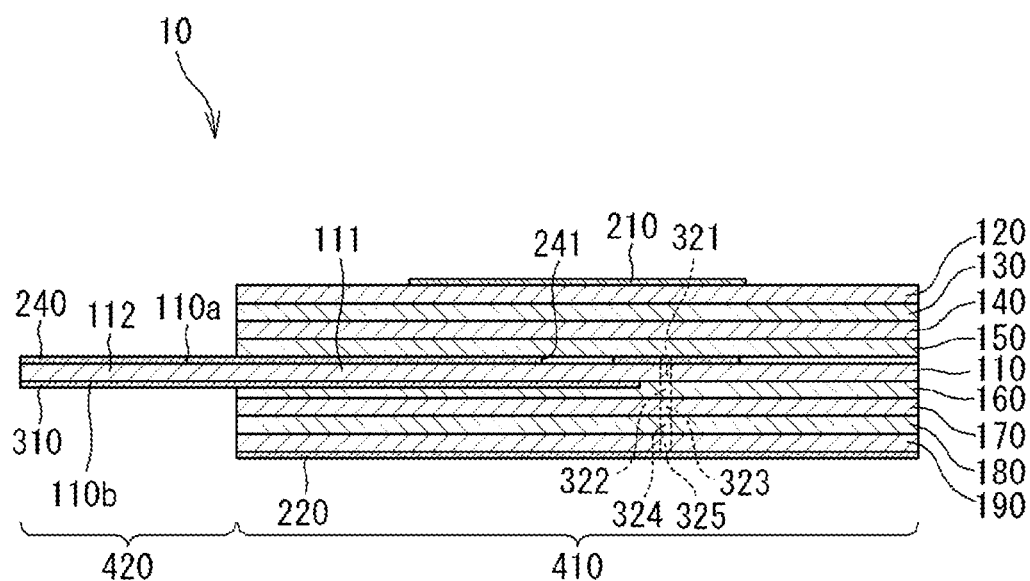
FIG. 3 is a cross-sectional view taken along line A-A in FIG. 1.

FIG. 1 to FIG. 3 show a planar antenna 10 according to one embodiment. The planar antenna 10 is, for example, an antenna for millimeter waves.

The illustrated planar antenna 10 is configured such that a plurality of subsidiary films 120, 130, 140, 150, 160, 170, 180, and 190 are laminated over a single main film 110. A material of the main film 110 is not particularly limited as long as it is a dielectric body while it is preferable to use a material that can be used as a base film of the flexible substrate, examples of which material include liquid crystal polymer (LCP) and polyimide (PI). The main film 110 has a thickness of around 10 μm to 50 μm, and a flexibility to allow bending deformation of the film.

A material of the subsidiary films 120 to 190 is not particularly limited as long as it is a dielectric body while similarly to the main film 110, it is preferable to use a material that can be used as a base film of the flexible substrate, examples of which material include liquid crystal polymer (LCP) and polyimide (PI). The material of the subsidiary films 120 to 190 may be the same as or different from that of the main film 110. The plurality of films 120 to 190 may be made of the same material or of different materials.

Each of the subsidiary films 120 to 190, for example, has a thickness of around 10 μm to 50 μm, and a flexibility to allow bending deformation of the film. Each of the subsidiary films 120 to 190 may be thicker or thinner than the main film 110. The thicker the subsidiary films 120 to 190 are, the more advantageous it is for providing the antenna with a wider bandwidth. A permittivity of each of the subsidiary films 120 to 190 may be lower or higher than the main film 110. The low permittivity is advantageous for providing the antenna with a wider bandwidth. Further, a rigidity of the subsidiary films 120 to 190 may be higher or lower than the main film 110.

Hereinafter, the description is given assuming that the main film 110 and the subsidiary films 120 to 190 are made of the same material (for example, LCP) and have the same thickness (for example, 50 μm). If the plurality of films 110, and 120 to 190 to be laminated are made of the same material and have the same thickness, it is advantageously possible to facilitate designing of antenna characteristics.

The subsidiary films 120 to 190 are rectangular, and of the same size in planar view. The main film 110 is larger than the subsidiary films 120 to 190. The main film 110 includes a first region 111 and a second region 112. The first region 111 is provided by laminating the subsidiary films 120 to 190, and is in a rectangular shape having the same size as that of the subsidiary films 120 to 190. The second region 112 is a part of the main film 110 excluding the region corresponding to the first region 111. The first region 111 and the second region 112 are provided integrally in a seamless manner. While the illustrated second region 112 has a width W that is narrower the first region 111, the second region 112 may have the same width as the first region 111.

The second region 112 extends from a side surface of a laminated structure 410 including the first region 111 and the subsidiary films 120 to 190. The illustrated second region 112 is a flexible dielectric film portion 420 extending from one side surface of the laminated structure 410 that is rectangular in planar view. Here, three other side surfaces of the laminated structure 410 are flat surfaces.

The planar antenna 10 according to the embodiment is a microstrip antenna having a radiating element 210, and a ground conductor (first ground conductor) 220 that faces against the radiating element 210. The radiating element 210 and the ground conductor 220 are provided for the laminated structure 410. The laminated structure 410 is an antenna base 410 having the radiating element 210 and the ground conductor 220. The antenna base 410 is configured such that the subsidiary films 120 to 190 are laminated over the main film 110, and therefore is thicker than the dielectric film portion 420 over which the subsidiary films 120 to 190 are not laminated. According to the antenna base 410, the laminated structure 410 as a whole constitutes a dielectric layer sandwiched between the radiating element 210 and the ground conductor 220. Here, a part of the laminated structure 410 may constitute a dielectric layer sandwiched between the radiating element 210 and the ground conductor 220. Specifically the antenna base 410 may include a layer that is not sandwiched between the radiating element 210 and the ground conductor 220.

In the following description, out of the antenna base 410, a layer constituted by the first region 111 of the main film 110 is referred to as a main layer, and layers respectively constituted by the subsidiary films 120 to 190 are referred to as subsidiary layers. The illustrated antenna base 410 includes one main layer 111 and a plurality of (eight) subsidiary layers 120 to 190 laminated over the main layer 111. The main layer 111 and the dielectric film portion 420 are constituted by the single film 110 and therefore seamless. In other words, the dielectric film 420 extends laterally from the main layer 111 of the antenna base 410 in a seamless manner.

The radiating element 210 is provided over the subsidiary layer 120 that is disposed on one side of the laminated structure 410 in a through-thickness direction (an uppermost layer in FIG. 1 to FIG. 3). While the illustrated radiating element 210 is square, the radiating element 210 may be circular. The radiating element 210 is provided by, for example, printing a conductor over the subsidiary layer 120 constituted by a dielectric body.

The ground conductor 220 is provided over the subsidiary layer 190 that is disposed on the other side of the laminated structure 410 in the through-thickness direction (lowermost layer in FIG. 1 to FIG. 4). The ground conductor 220 is larger than the radiating element 210. While the illustrated ground conductor 220 is square as it is provided over an entire surface of the rectangular subsidiary layer 190, its shape is not particularly limited. The ground conductor 220 is provided by, for example, printing a conductor over the film 190 as a dielectric body.

The main film 110 has a first surface 110a and a second surface 110b. Out of the both surfaces 110a and 110b of the main film 110, the first surface 110a is a surface on a side of the subsidiary films 120, 130, 140, and 150. The second surface 110b is a surface opposite of the first surface 110a, and on a side of the subsidiary films 160, 170, 180, and 190.

The second surface 110b of the main film 110 is provided with a power feeder line (first power feeder line) 310 for feeding power to the radiating element 210. The power feeder line 310 is provided so as to extend from the second region 112 (the dielectric film portion 420) to the first region 111. To the radiating element 210, power is fed by an electromagnetic coupling type power feeding. The electromagnetic coupling type power feeding will be described later. The power feeder line 310 is provided by, for example, printing a conductor over the second surface 110b of the film 110 as a dielectric body.

The first surface 110a of the main film 110 is provided with a ground conductor (second ground conductor) 240 for power feeding. In this embodiment, the ground conductor 240 faces against the power feeder line 310 via the film 110 as a dielectric body so that the power feeder line 310 serves as a microstrip line. The ground conductor 240 is provided by, for example, printing a conductor over the first surface 110a of the film 110 as a dielectric body.

In order to connect the ground conductor 240 to the ground conductor 220, the main layer 111 and the subsidiary layers 160, 170, 180, and 190 are respectively provided with through holes 321, 322, 323, 324, and 325. By a conductor disposed within each of the through holes 321, 322, 323, 324, and 325, the ground conductor 240 and the ground conductor 220 are electrically connected.

For power feeding by electromagnetic coupling, the ground conductor 240 is provided with a slot 241. the radiating element 210 and the ground conductor 220 are electromagnetically coupled via the slot 241. The power feeder line 310 may serve a function as a power feeder line, as the power feeder line is disposed between the radiating element 210 and the ground conductor 220 that are electromagnetically coupled.

While an illustrated dielectric layer 410 is constituted by the main layer 111 and the plurality of subsidiary layers 120 to 190, the dielectric layer 410 may be constituted by the main layer 111 and a single subsidiary layer. Alternatively, the dielectric layer 410 may be constituted only by one or more subsidiary layers. In this embodiment, as the dielectric layer 410 is thicker than the dielectric film portion 420 (the main film 110), provision of a wider bandwidth may be facilitated. For example, by making a thickness of the dielectric layer 410 around 200 µm to 500 µm, it is possible to ensure a bandwidth of 1 GHz or higher of millimeter waves.

As the antenna base 410 including the dielectric layer 410 is thick, its flexibility is reduced as compared to the dielectric film portion 420. However, the dielectric film portion 420 is thin and its flexibility is maintained. Therefore, in a region in which the power feeder line 310 is provided, a flexibility of the same level as that of a planar antenna provided for a flexible substrate. In addition, as the planar antenna 10 according to the embodiment is configured for millimeter waves, the radiating element 210 may be of a size whose one side is around several millimeters, and the antenna base 410 may be of a size whose one side is around 10 mm. As described above, by a configuration for millimeter waves, it is possible to decrease the size of the antenna base 410 with low flexibility. By limiting a portion with low flexibility it is possible to easily ensure a flexibility of the antenna 10 as a whole, and an installation capability of the antenna 10 may not be impaired largely.

In the illustrated antenna base 410, a number of the subsidiary layers (first subsidiary layers) 120, 130, 140, and 150 that are laminated on the side of the first surface 110a of the main layer 111 is four, and a number of the subsidiary layers (second subsidiary layers) 160, 170, 180, and 190 that are laminated on the side of the second surface 110b of the main layer 111 is also four. As the numbers of lamination of the subsidiary layers are identical on the both surfaces 110a and 110b of the main layer 111, it is advantageous for preventing deformation, such as warpage, of the antenna base 410 as a laminated structure. In addition, laminating the subsidiary layers of the same number and the same thickness symmetrically on the both surfaces 110a and 110b of the main layer 111, it is possible to prevent deformation, such as warpage, of the antenna base 410 more effectively.

In the embodiment, the thickness of the subsidiary layers 120 to 190 is the same as that of the main layer 111. However, by using the subsidiary layers thicker than the main layer 111, it is possible to increase the thickness of the antenna base 410 with a fewer number of laminations. It is preferable to use layers of a smaller thickness tolerance as the main layer 111 and the subsidiary layers 120 to 190, in order to reduce a thickness error of the dielectric layer 410. If there is a thickness error as a result of lamination of relatively thin subsidiary layers, it is possible to make the thicknesses on the both sides equal by varying the numbers of lamination on the both surfaces 110a and 110b of the main layer 111.

Joining between the main layer and the subsidiary layers, and joining between the subsidiary layers may be performed by hot press, for example. If the main layer and the subsidiary layers are made of a thermoplastic resin, these layers are joined by, in a state in which the main layer 111 and the subsidiary layers 120 to 190 are placed over one another, by melting surfaces of the layers by heating and applying a pressure in a through-thickness direction of the layers.

More specifically for example, the subsidiary layer 150 and the subsidiary layer 160 are placed over the both surfaces 110a and 110b of the main layer 111, first heat pressing is performed, and thus a laminated structure of three layers 111, 150, and 160 is formed. Then, the subsidiary layers 140 and 170 are placed over the both surfaces of the three-layer laminated structure, second heat pressing is performed, and thus a laminated structure of five layers 111, 140, 150, 160, and 170 is formed. Similarly by performing third and fourth heat pressing, the laminated structure 410 of nine layers 111, 140, 150, and 160 is formed. As the main layer 111 is integrally provided with the dielectric film portion 420, the planar antenna 10 in which the dielectric film portion 420 seamlessly extends from the main layer 111 is obtained once the laminated structure 410 is obtained.

In order to join the layers, it is possible to use an adhesive agent, in addition to joining of the layers by melting. It should be noted that the radiating element 210, the ground conductors 220 and 240, the power feeder line 310, the through holes 321, 322, 323, and 324 are provided before the layers are joined.

[2.2 Wireless Module]

Figure 4:
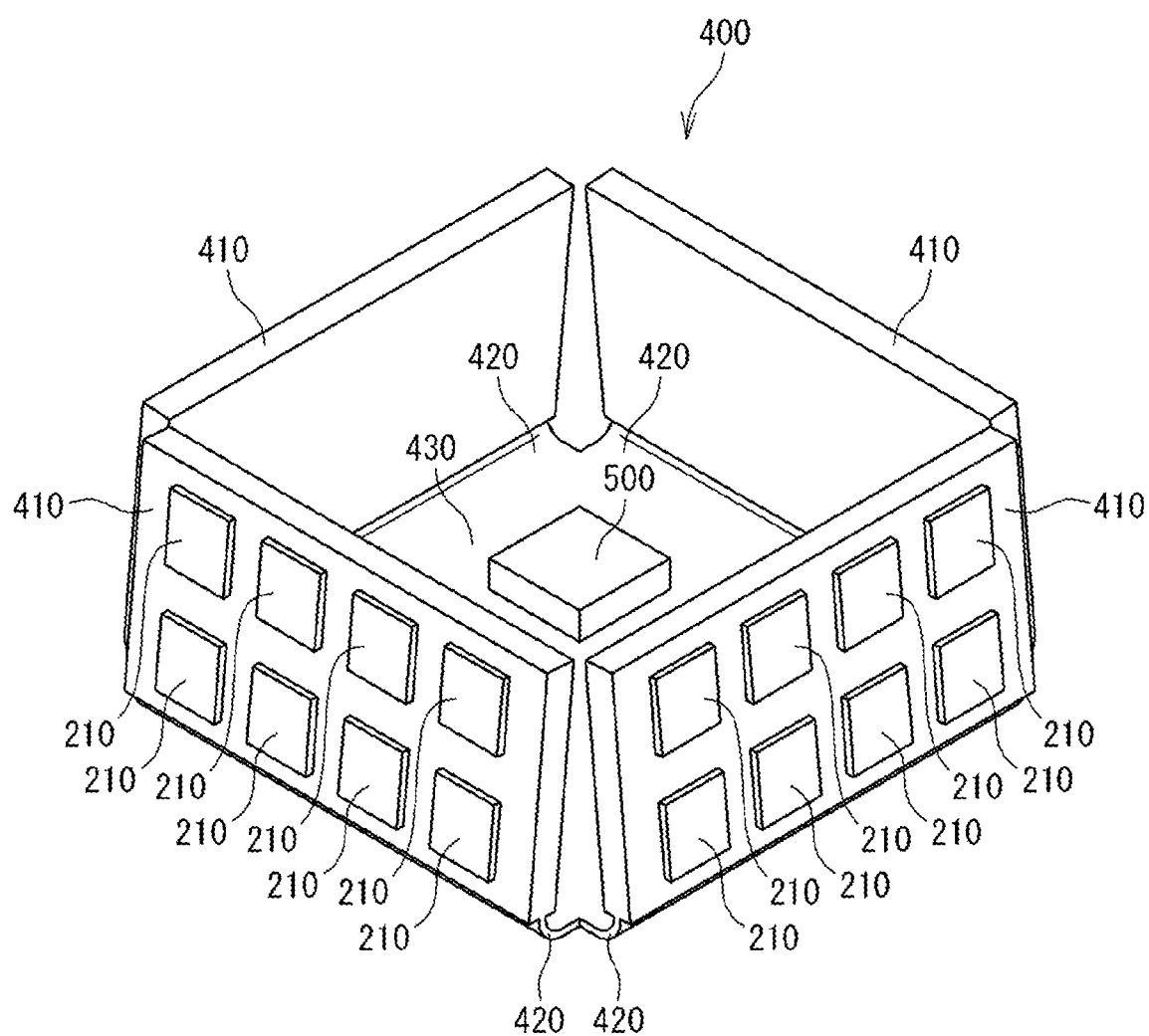
FIG. 4 is a perspective view of an RF front-end module having the planar antenna.

FIG. 4 shows a wireless module 400 utilizing the configuration of the planar antenna 10 shown in FIG. 1 to FIG. 3. The illustrated wireless module 400 is an RF front-end module of a mobile station in mobile communication. The mobile communication is communication using millimeter waves, for example, and more specifically a fifth generation mobile communication system (5G). In the fifth generation mobile communication system, for example, a wider bandwidth of 1 GHz or higher is required.

A RF front-end module 400 includes four antenna bases 410, and each of the antenna bases 410 is provided with a plurality of radiating elements 210. By the radiating elements 210 provided for the four antenna bases 410, it is possible to obtain an omni-directional property in a horizontal plane.

The dielectric film portions 420 that extend from side surfaces of the four antenna bases 410 connect four sides of a rectangular base flexible substrate 430 with the four antenna bases 410 in an integral manner. Here, the dielectric film portions 420 and the base flexible substrate 430 may be provided integrally or as separately.

On the base flexible substrate 430, an integrated circuit serving as a wireless unit 500 is mounted. The wireless unit 500 according to the embodiment includes a transmitter and a receiver. The transmitter and the receiver include a circuit element for processing RF signals, such as an amplifier. The wireless unit 500 and the radiating elements 210 are connected by a power feeder line provided for the base flexible substrate 430 and the power feeder line 310 provided for the dielectric film portion 420. The base flexible substrate 430 may be provided with a baseband processor for processing baseband signals. Here, a portion corresponding to the base flexible substrate 430 may be a rigid substrate.

Portions corresponding to the antenna bases 410 of the wireless module 400 in FIG. 4, are made thick for providing a wider bandwidth, and portions corresponding to the dielectric films 420 are thin and flexible. As illustrated, by flexing the dielectric films 420, it is possible to provide the base flexible substrate 430 with the antenna bases 410 in an upright manner.

[2.3 Variations of Planar Antenna]

Figure 5A:
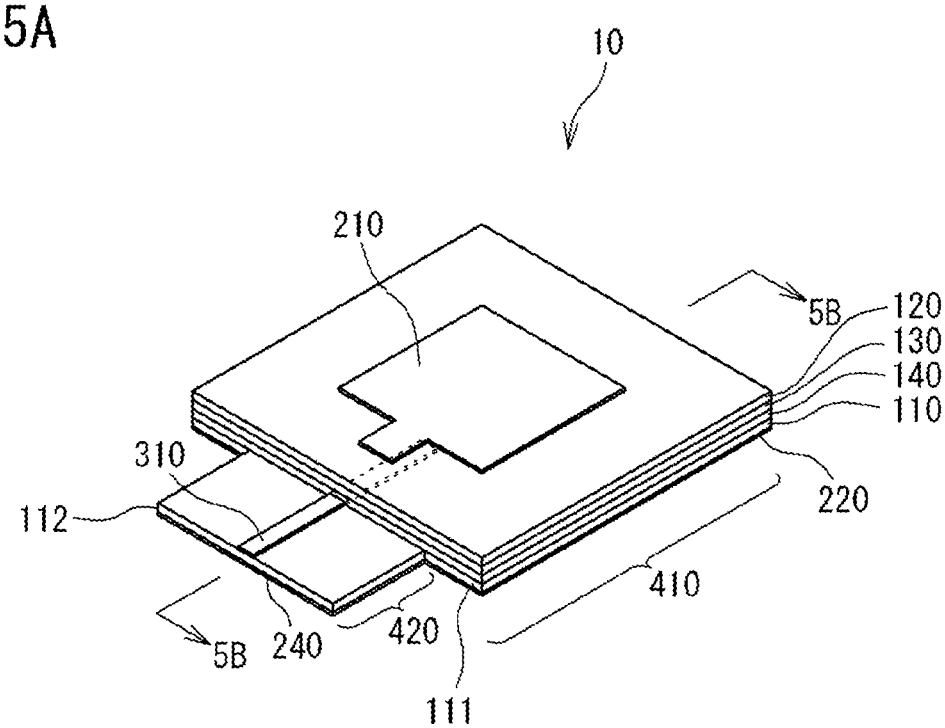
FIG. 5A is a perspective view showing a first modified example of the planar antenna.
Figure 5B:
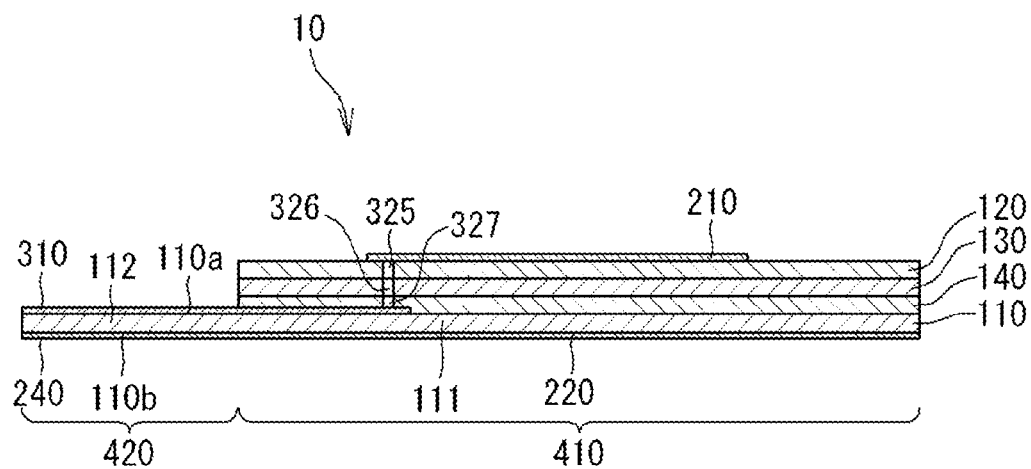
FIG. 5B is a cross-sectional view taken along line 5B-5B in FIG. 5A.

FIG. 5A and FIG. 5B show a first modified example of the planar antenna 10. The planar antenna 10 according to the first modified example is configured by laminating a plurality of (three) subsidiary films 120, 130, and 140 only over one side 110a of a single main film 110.

The radiating element 210 is provided for the subsidiary film 120. The first ground conductor 220 is provided for the first region 111 of the second surface 110b of the main film 110, and the second ground conductor 240 is provided for the second region 112 of the second surface 110b of the main film 110. The antenna base 410 constituted by a laminated structure of the first region 111 of the main film (main layer) and the subsidiary films (subsidiary layers) 120-140 is a dielectric layer disposed between the radiating elements 210 and the first ground conductor 220.

The second region 112 of the first surface 110a of the main film 110 is provided with the power feeder line 310. In the first modified example, a direct power feeding technology is used. The power feeder line 310 is connected to the radiating elements 210 via through holes 325, 32, and 327 respectively provided for the subsidiary films 120, 130, and 140.

In the first modified example, similarly a combination of the thick antenna base 410 and the thin dielectric film portion 420 may be obtained. The dielectric film portion 420 seamlessly extends from the main layer 111 included in the antenna base 410, and excellent integrity may be provided between the antenna bases 410 and the dielectric film portion 420.

Figure 6A:
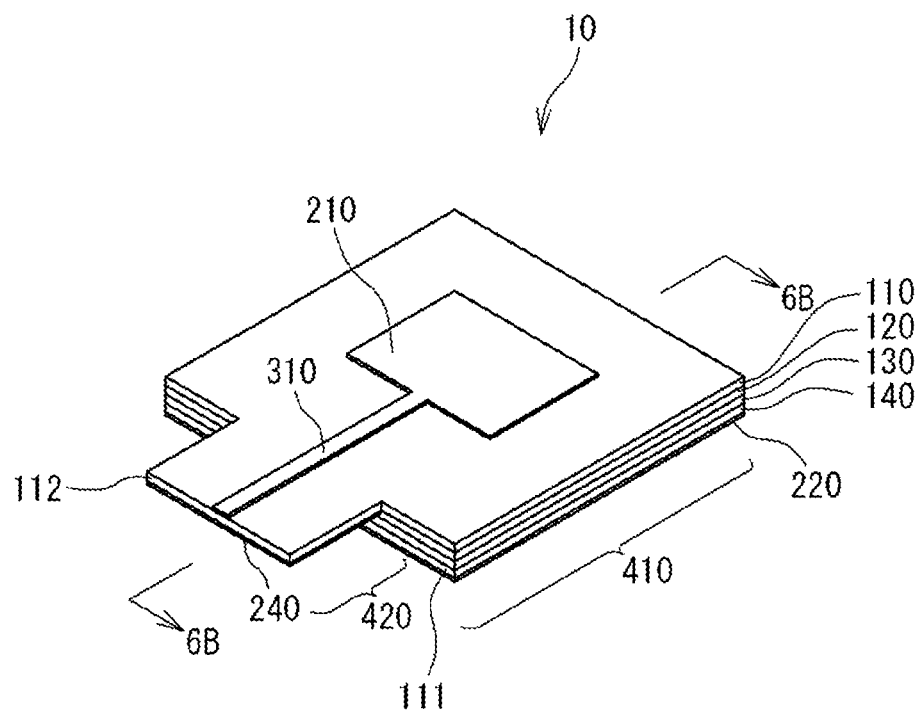
FIG. 6A is a perspective view showing a second modified example of the planar antenna.
Figure 6B:
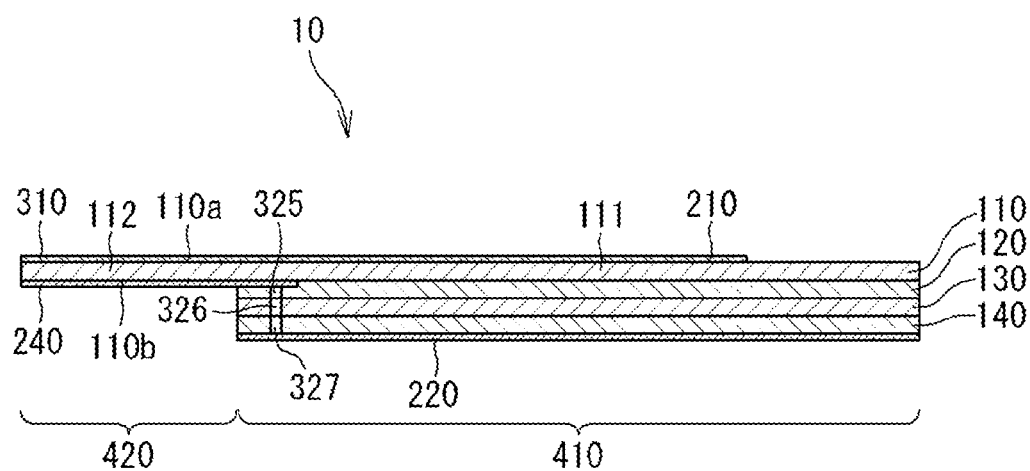
FIG. 6B is a cross-sectional view taken along line 6B-6B in FIG. 6A.

FIG. 6A and FIG. 6B show a second modified example of the planar antenna 10. The planar antenna 10 according to the second modified example is configured by laminating a plurality of (three) subsidiary films 120, 130, and 140 only over one side 110b of a single main film 110.

The radiating elements 210 is provided for the first region (main layer) 111 of the first surface 110a of the main film 110. The first ground conductor 220 is provided for subsidiary film 140, and the second ground conductor 240 is provided for the second region 112 of the second surface 110b of the main film 110. The first ground conductor 220 is connected to the second ground conductor 240 via the through holes 325, 326, and 327 respectively provided for the subsidiary films 120, 130, and 140. The antenna base 410 constituted by a laminated structure of the first region 111 of the main film (main layer) and the subsidiary films (subsidiary layers) 120 to 140 is a dielectric layer disposed between the radiating elements 210 and the first ground conductor 220.

The second region 112 of the first surface 110a of the main film 110 is provided with the power feeder line 310 directed toward the radiating element 210. In the second modified example, the direct power feeding technology is also used. The power feeder line 310 is provided for the second region (the dielectric film portion 420) that is seamless with the main film first region (main layer) 111, and therefore may be easily connected to the radiating element 210. the power feeder line 310 and the radiating element 210 are integrally provided by, for example, printing conductors over the film 110.

In the second modified example, similarly, a combination of the thick antenna base 410 and the thin dielectric film portion 420 may be obtained. The dielectric film portion 420 seamlessly extends from the main layer 111 included in the antenna base 410, and excellent integrity may be provided between the antenna bases 410 and the dielectric film portion 420.

Figure 7A:
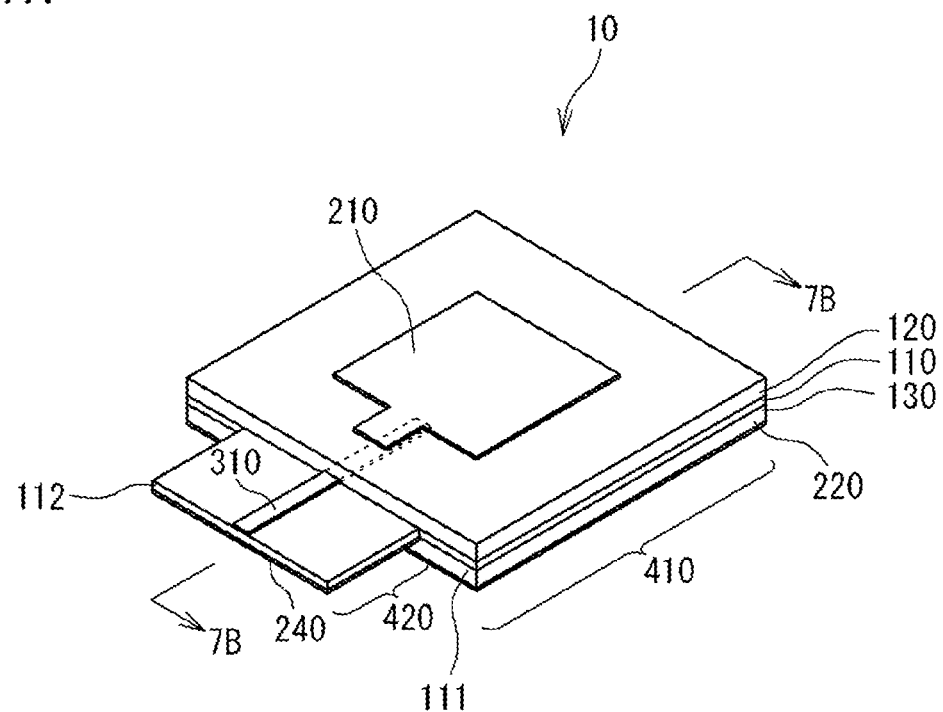
FIG. 7A is a perspective view showing a third modified example of the planar antenna.
Figure 7B:
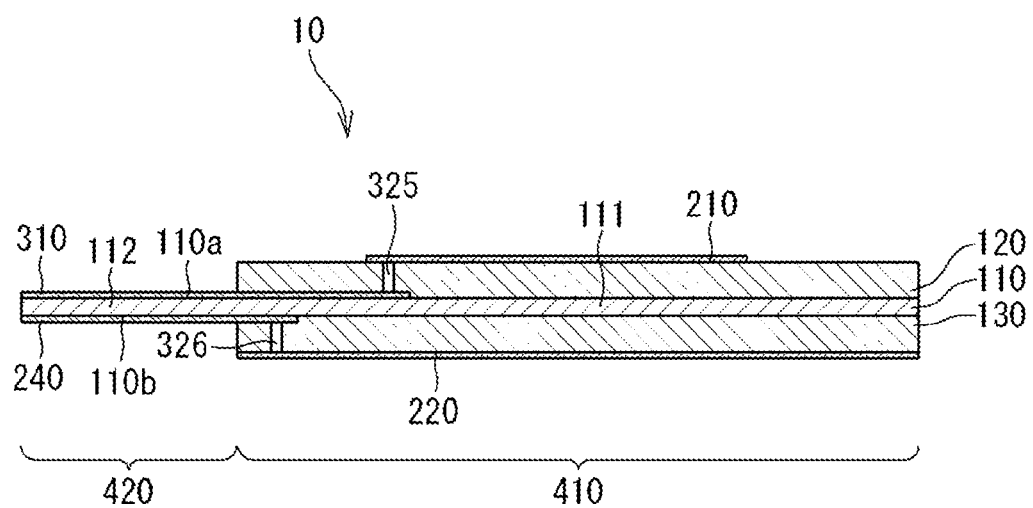
FIG. 7B is a cross-sectional view taken along line 7B-7B in FIG. 7A.

FIG. 7A and FIG. 7B show a third modified example of the planar antenna 10. The planar antenna 10 according to the third modified example is configured by laminating the subsidiary films 120 and 130 thicker than the main film 110 over both surfaces 110a and 110b of a single main film 110.

The radiating element 210 is provided for the subsidiary film 120. The power feeder line 310 is provided for the second region 112 of the first surface 110a of the main film 110. The radiating elements 210 is connected to the power feeder line 310 via the through hole 325 provided for the subsidiary film 120. In the third modified example, the direct power feeding technology is also used.

The first ground conductor 220 is provided for the subsidiary film 130. The second ground conductor 240 is provided for the second region 112 of the second surface 110b of the main film 110. The first ground conductor 220 is connected to the second ground conductor 240 via the through hole 326 provided for the subsidiary film 130.

The antenna base 410 constituted by a laminated structure of the first region 111 of the main film (main layer) and the subsidiary films 120 and 130 is a dielectric layer disposed between the radiating elements 210 and the first ground conductor 220. In the fourth modified example, similarly a combination of the thick antenna base 410 and the thin dielectric film portion 420 may be obtained.

Figure 8A:
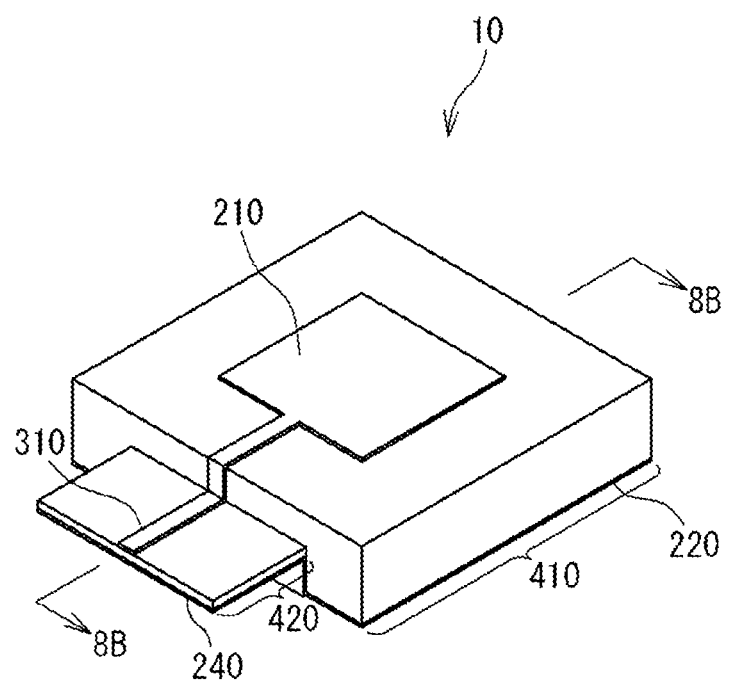
FIG. 8A is a perspective view showing a fourth modified example of the planar antenna.
Figure 8B:
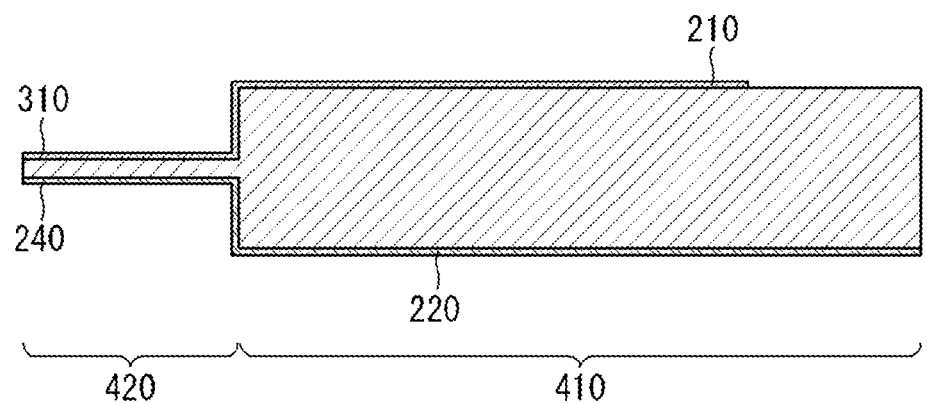
FIG. 8B is a cross-sectional view taken along line 8B-8B in FIG. 8A.

FIG. 8A and FIG. 8B show a fourth modified example of the planar antenna 10. The planar antenna 10 according to the fourth modified example includes the thin dielectric film portion 420, and the antenna base 410 thicker than the dielectric film portion 420. In the fourth modified example, the antenna base 410 is not a laminated structure, but a single-layer structure constituted by a dielectric body. The dielectric film portion 420 laterally extends from a side surface of the dielectric layer 410 having a single-layer structure.

The radiating element 210 and the first ground conductor 220 are disposed such that the dielectric layer 410 is sandwiched therebetween. The dielectric film portion 420 is provided with the power feeder line 310 connected to the radiating elements 210, and the second ground conductor 240 connected to the first ground conductor 220. In the fourth modified example, similarly a combination of the thick antenna base 410 and the thin dielectric film portion 420 may be obtained. In the fourth modified example, as the thick antenna bases 410 is provided integrally, it is possible to omit a lamination step in manufacturing.

Components that are not particularly described in the above first to fourth modified examples are the same as those of the planar antenna 10 shown in FIG. 1 to FIG. 3.

3. Additional Statement

It should be noted that the disclosed embodiments are to be understood as being in every respect illustrative and exemplary, but not restrictive. The scope of the present invention is not limited to the above described examples, but instead, defined by the claims, and intended to include all equivalents to the claims as well as any alterations made within the scope of the invention.

REFERENCE SIGNS LIST

10: PLANAR ANTENNA
110: MAIN FILM
110a: FIRST SURFACE
110b: SECOND SURFACE
111: FIRST REGION (MAIN LAYER)
112: SECOND REGION
120: SUBSIDIARY FILM (SUBSIDIARY LAYER)
130: SUBSIDIARY FILM (SUBSIDIARY LAYER)
140: SUBSIDIARY FILM (SUBSIDIARY LAYER)
150: SUBSIDIARY FILM (SUBSIDIARY LAYER)

160: SUBSIDIARY FILM (SUBSIDIARY LAYER)
170: SUBSIDIARY FILM (SUBSIDIARY LAYER)
180: SUBSIDIARY FILM (SUBSIDIARY LAYER)
190: SUBSIDIARY FILM (SUBSIDIARY LAYER)
210: RADIATING ELEMENT
220: FIRST GROUND CONDUCTOR
240: SECOND GROUND CONDUCTOR
241: SLOT
310: FIRST POWER FEEDER LINE
321: THROUGH HOLE
322: THROUGH HOLE
323: THROUGH HOLE
325: THROUGH HOLE
326: THROUGH HOLE
327: THROUGH HOLE
400: WIRELESS MODULE (FRONT-END MODULE)
410: ANTENNA BASE (DIELECTRIC LAYER, LAMINATED STRUCTURE)
420: DIELECTRIC FILM PORTION
430: BASE FLEXIBLE SUBSTRATE
500: WIRELESS UNIT

The invention claimed is:

1. A wireless module comprising:
   a radiating element;
   a flexible dielectric film portion;
   a power feeder line provided for the dielectric film portion, and configured to feed power to the radiating element;
   a first ground conductor facing against the radiating element;
   an antenna base having a dielectric layer that is disposed between the radiating element and the first ground conductor, the dielectric layer having a laminated structure in which a plurality of films is continuously laminated, the dielectric film portion extending from a side surface of the antenna base toward an outside of the antenna base; and
   a wireless unit to which the power feeder line is connected,
   wherein the laminated structure includes a main layer provided with the dielectric film portion and one or more subsidiary layers laminated on a region of the main layer excluding the dielectric film portion.

2. The wireless module according to claim 1, wherein the main layer is seamless with the dielectric film portion.

3. The wireless module according to claim 1, wherein the one or more subsidiary layers include one or more first subsidiary layers and one or more second subsidiary layers, the first subsidiary layers being laminated on a side of a first surface of the main layer, the second subsidiary layers being laminated on a side of a second surface as a surface opposite of the first surface.

4. The wireless module according to claim 1, wherein one of the first ground conductor and the radiating element is provided for the main layer.

5. The wireless module according to claim 1, wherein the first ground conductor is provided for the main layer, and connected to a second ground conductor for power feeding, the second ground conductor being provided for the dielectric film portion seamless with the main layer.

6. The wireless module according to claim 1, wherein the radiating element is provided for the main layer, and connected to the power feeder line provided for the dielectric film portion seamless with the main layer.

7. A wireless module comprising:
   a plurality of planar antennas;
   a base substrate to which the plurality of planar antennas is connected; and
   a wireless unit provided in the base substrate, and configured to process wireless signals,
   wherein, each planar antenna includes:
      a radiating element;
      a flexible dielectric film portion connected to the base substrate;
      a power feeder line provided in the dielectric film portion at least in part, and configured to connect the radiating element and the wireless unit to each other;
      a first ground conductor opposites to the radiating element; and
      an antenna base having a dielectric layer disposed between the radiating element and the first ground conductor, and
   the dielectric film portion extends from a side surface of the antenna base and flexibly connects the base substrate and the antenna base to each other.

8. The wireless module according to claim 7, wherein the dielectric layer has a laminated structure in which a plurality of films is continuously laminated, and the laminated structure includes a main layer provided with the dielectric film portion and one or more subsidiary layers laminated on a region of the main layer excluding the dielectric film portion.

* * * * *